United States Patent [19]

Grawey et al.

[11] Patent Number: 5,055,734
[45] Date of Patent: Oct. 8, 1991

[54] SINGLE-PIECE MULTIPLE ELECTRODE CONDUCTOR

[75] Inventors: Charles E. Grawey; L. Ted Johnson, both of Peoria; John M. Sloma, Lacon; John F. Szentes, Peoria, all of Ill.

[73] Assignee: Caterpillar Inc., Peoria, Ill.

[21] Appl. No.: 590,110

[22] Filed: Sep. 28, 1990

[51] Int. Cl.⁵ .......................................... H01L 41/08
[52] U.S. Cl. .................................... 310/366; 310/328
[58] Field of Search ..................... 310/366, 32 F, 328

[56] References Cited

U.S. PATENT DOCUMENTS

| | | | |
|---|---|---|---|
| 3,501,099 | 3/1970 | Benson | 239/535 |
| 3,589,345 | 6/1971 | Benson | 123/32 E |
| 4,460,842 | 7/1984 | Waanders et al. | 310/328 |
| 4,471,256 | 9/1984 | Igashira et al. | 310/328 |
| 4,499,566 | 2/1985 | Abbott | 310/366 |
| 4,523,121 | 6/1985 | Takahashi et al. | 310/328 |
| 4,695,034 | 9/1987 | Shimizu et al. | 251/129.06 |
| 4,752,712 | 6/1988 | Tomita et al. | 310/328 |
| 4,885,498 | 12/1989 | Wakita | 310/328 |

FOREIGN PATENT DOCUMENTS

| | | | |
|---|---|---|---|
| 7532009 | 6/1976 | France | 310/328 |
| 0211974 | 9/1987 | Japan | 310/366 |
| 0234184 | 4/1988 | Japan | 310/366 |
| 6909652 | 6/1969 | Netherlands | 310/366 |

OTHER PUBLICATIONS

*Piezoelectric Materials* (Physics International Company), date unknown.

Primary Examiner—Mark O. Budd
Assistant Examiner—Thomas M. Dougherty
Attorney, Agent, or Firm—Sterne, Kessler, Goldstein & Fox

[57] ABSTRACT

A single-piece multiple electrode conductor for a piezoelectric solid state motor stack with piezoelectric disks arranged with a plurality of electrodes. When the electrodes are connected to and biased by a source of electrical potential, an axial displacement is produced between opposite end surfaces of the stack. The single-piece multiple electrode conductor has a spine member for conducting an electrical potential to the piezoelectric disks. Extending from the spine member are a plurality of rib portions which conduct electrical potential to the piezoelectric disks which form the piezoelectric stack.

10 Claims, 2 Drawing Sheets

SINGLE-PIECE MULTIPLE ELECTRODE CONDUCTOR

BACKGROUND OF THE INVENTION

1. Field of the Invention

The field of the invention relates generally to solid state motor actuators. More particularly, the invention relates to a single-piece multiple electrode conductor for piezoelectric solid state motor stacks.

2. Related Art

For decades electroexpansive materials have been employed in stacked structures for producing actuation used for fuel injection and valve control in diesel engines, for example. Commercially manufactured solid state motor stacks, or actuators, are produced using piezoelectric disks interleaved with metal foil electrodes. Application of high voltage, and resulting high peak current, power to alternately biased electrodes causes each of the piezoelectric disks to expand or axially distort. The additive deflection of the stacked disks is typically amplified by hydraulics to effectuate useful actuation.

An example of a conventional electromechanical actuator having an active element of electroexpansive material is found in U.S. Pat. No. 3,501,099 to Glendon M. Benson. Benson's 1970 patent is directed to both an actuation amplification structure and a method for manufacturing piezoelectric stacks. Sheets of ceramic material are rolled, compacted and punched into ceramic disks. After a cleaning process, the disks are stacked with alternate sets of continuous disk electrodes disposed between the ceramic disks. Alternate electrodes of the Benson structure are interconnected to one another to form a first group using straps. A second alternate group of electrodes is similarly interconnected. The stacks undergo a pressurized cold-welding process, followed by an elevated temperature and pressure bonding process after lead wire electrodes are connected to the two electrode groups. The stacks are poled by application of a DC voltage and then encapsulated with a plastic insulative cover prior to final mounting within a transducer housing.

Benson's above-described electrode structure represents a common serial approach to electrode interconnection. Another common interconnection scheme is the bus bar approach.

The bus bar scheme uses a common bar or wire to connect every other electrode in a parallel fashion. Each electrode includes a tab portion extending tangentially from a point on the circumference of the electrode. The tab is used to solder or weld the bus bar to the electrode. Conventionally, each stack uses two bus bars to connect the power supply leads to the two respective interconnected electrode groups.

Both of the above-discussed electrode interconnection structures suffer from various disadvantages. In Benson's strapped or chain structure current is drawn serially through the whole structure, thereby incurring unnecessary power losses. Additionally, Benson's chain structure makes assembly of ceramic disk/electrode stacks difficult. In contrast, structurally, the bus bar becomes somewhat rigid due to the soldering of the many tabs, thus, inhibiting stack actuation. Moreover, assembly and soldering of the bus bar structure requires many process steps. Additionally, potential high power losses may occur if the soldering joints are not of good quality.

The present invention overcomes the deficiencies of the conventional technology noted above.

SUMMARY OF THE INVENTION

The present invention is directed to a single-piece multiple electrode conductor for a piezoelectric solid state motor stack with piezoelectric disks arranged with a plurality of electrodes. When the electrodes are connected to and biased by a source of electrical potential, an axial displacement is produced between opposite end surfaces of the stack. The single-piece multiple electrode conductor has a spine member for conducting an electrical potential to the piezoelectric disks. Extending from the spine member are a plurality of rib portions which conduct electrical potential to the piezoelectric disks which form the piezoelectric stack.

The invention may further include a series of accordion style folds which eventually become the spine member of a single-piece multiple electrode conductor.

Still further, the invention may include disk or tab portions extending from rib portions which extend from the spine member.

FEATURES AND ADVANTAGES OF THE INVENTION

The present invention not only overcomes the deficiencies of conventional technology, noted above, but also provides the following features and advantages: First, since the single-piece multiple electrode conductor is formed from one piece of metal and may be folded to fit in a single piezoelectric solid state motor stack, no welding or fusing of electrode tabs to a conductor spine member is needed. This feature is advantageous since the making and assembly of single-piece multiple electrode conductors may be done in a fast, automated process.

Second, since the single-piece multiple electrode conductor has a spine member formed by accordion folds (in some embodiments), the conductor is better able to handle the stresses of piezoelectric stack expansion and contraction over longer periods of time. This feature is advantageous since it allows stacks to have longer operating lifetimes.

BRIEF DESCRIPTION OF THE DRAWINGS

The invention will be better understood if reference is made to the accompanying drawings in which.

DETAILED DESCRIPTION OF THE PREFERRED EMBODIMENTS

Broadly, the present single-piece multiple electrode conductor invention is designed for an automated manufacturing process to yield high-quality, high-durability solid state motor stack electrode conductors in great volume.

Figure 1:
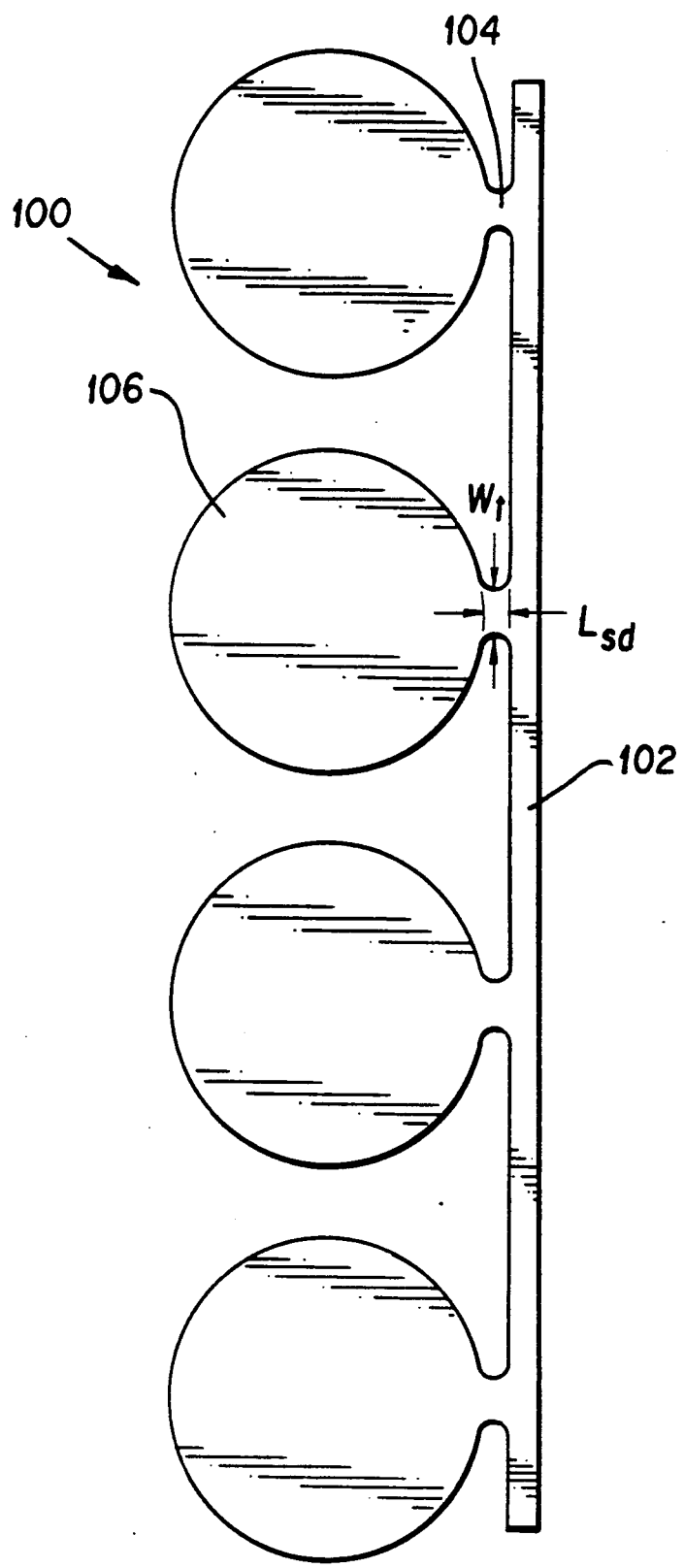
FIG. 1 is a diagrammatic representation of a single-piece multiple electrode conductor in accordance with the present invention.
Figure 2:
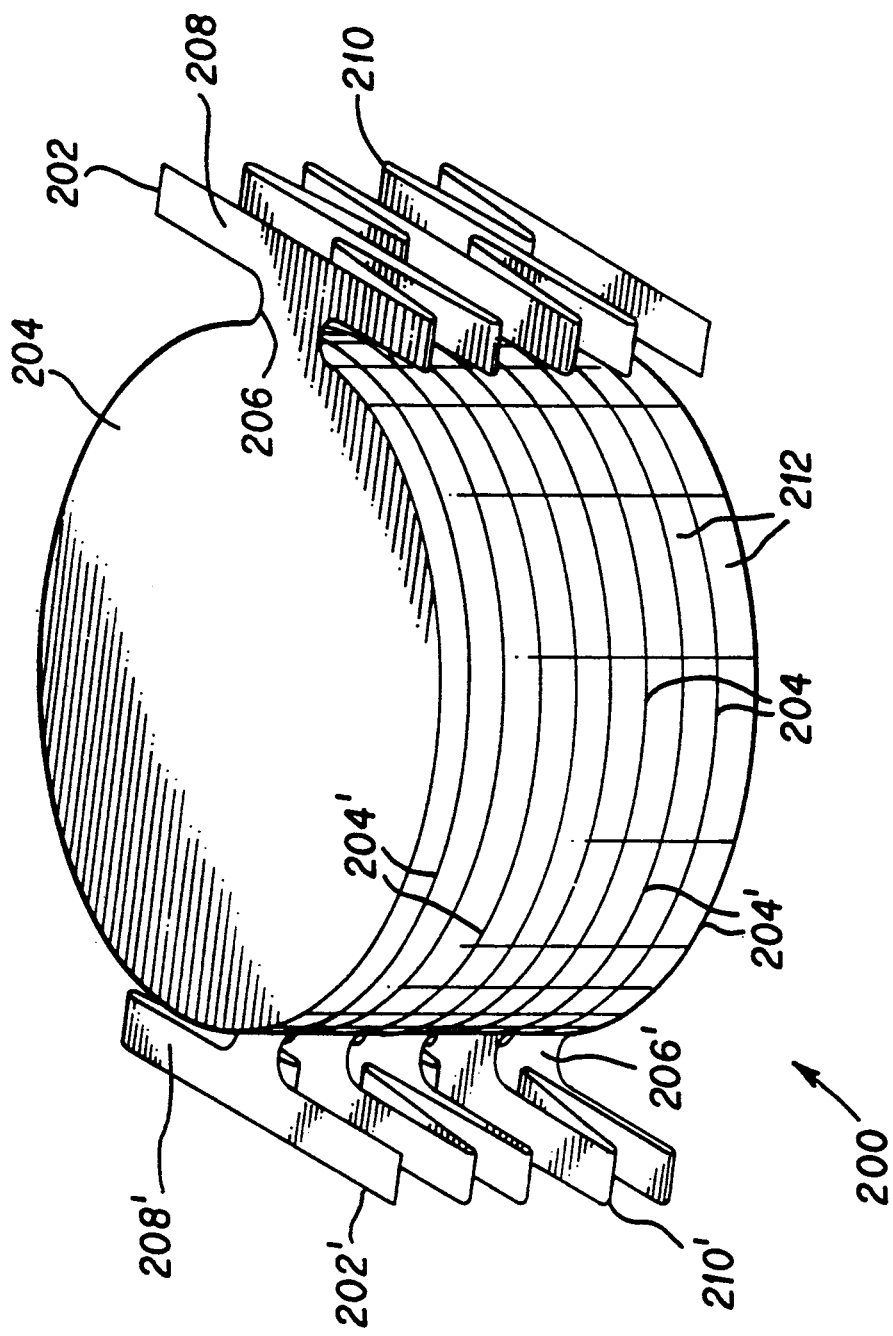
FIG. 2 is a diagrammatic representation of a partially assembled electric/ceramic disk stack including two folded single-piece multiple electrode conductors in accordance with the present invention.

FIG. 1 shows a top plan view of a single-piece multiple electrode conductor 100. The single piece multiple electrode conductor is stamped to form a spine member 102, a plurality of tab portions 104, and a plurality of disk portions 106. The width of spine member 102 should be minimized so that after folding the stamped structure to form the single piece electrode as shown in FIG. 2, the protruding distance maintained away from the piezoelectric stack is minimized. Tab portions 104 are integrally connected to the spine member 102.

In one embodiment, the tab portions 104 have a spine-to-disk length $L_{sd}$ which is approximately 20% less than the width $W_t$ of the tab portion. However, other dimensional relationships could be used as well. The disk portions 106 are integrally connected to the tab portions 104. FIG. 1 shows four tab and disk combinations, but more may be stamped depending on the application and size of the piezoelectric stack. A preferred embodiment of an assembled piezoelectric solid state electrode/disk stack is covered in the concurrently filed, commonly assigned co-pending application Ser. No. titled "Piezoelectric Solid State Motor", the entire disclosure of which is incorporated herein by reference.

It is noted that other methods may be employed to achieve the shape of the single-piece multiple electrode conductor 100. In addition to stamping, photoetching may also be used. The method of achieving structure 100 is not critical to carrying-out the present invention. Hence, other methods will become apparent to those of skill in the art.

FIG. 2 shows a folded example of the single-piece multiple electrode conductor as shown in FIG. 1 and which is described above. A partially assembled electric/ceramic disk stack 200 includes two folded single-piece multiple electrode conductors 202, 202' having a plurality of disk portions 204, 204', a plurality of tab portions 206, 206', and spine members 208, 208' with the accordion style folds. Ceramic disks 212 are interleaved with at least two folded single-piece multiple electrode conductors 204, 204'. The two conductors are connected to and biased by a source of electrical potential to produce an axial displacement between opposite end surfaces of the stack, as would become evident to those of skill in the art.

In this embodiment, the folds 210, 210' take on an "M" shaped characteristic in order to minimize the distance that the spine member 208 protrudes outwardly in a pseudo-tangential fashion. Any type fold may be used so long as the distance that the spine member protrudes is minimized.

Creased folds are not desired. Preferably, the fold should take the form of a smooth bend. The radius of curvature of the fold/bend may take a wide range of values. The upper value of this range is limited, however, by the distance between neighboring electrodes in the final stack (i.e., the radius of curvature of the fold/bend is limited by ceramic piezoelectric disk thickness). The lower value of this range is limited by the flow properties of any dielectric encapsulant used to coat a ceramic stack employing the present invention. An increasingly smaller radius of curvature (i.e., a creased fold) will cause voids. Voids may become hot-spots during operation of the piezoelectric solid state motor stack which may lead to malfunctions. Finally, a bend or very small radius of curvature is undesirable because the spine member may eventually break due to stresses introduced at the bend during operation.

While various embodiments of the present invention have been described above, it should be understood that they have been presented by way of example, and not limitation. Thus the breadth and scope of the present invention should not be limited by any of the above-described exemplary embodiments, but should be defined only in accordance with the following claims and their equivalents.

We claim:

1. A single-piece multiple electrode conductor for a piezoelectric solid state motor stack with piezoelectric disks arranged with a plurality of electrodes, comprising:

a spine member for conducting electrical potential; and a plurality of ribs integral with and extending from only one side of said spine member, and adapted to be interleaved with the piezoelectric disks in the stack;

wherein when the electrodes are interleaved with the piezoelectric disks in the stack and are connected to and biased by a source of electrical potential, an axial displacement is produced between opposite end surfaces of the stack.

2. A single-piece multiple electrode conductor according to claim 1, wherein said spine member further comprises a series of accordion-style folds.

3. A single-piece multiple electrode conductor according to claim 1, wherein each of said ribs further comprises a tab portion.

4. A single-piece multiple electrode conductor according to claim 1, wherein each of said ribs further comprises a disk portion.

5. A single-piece multiple electrode conductor according to claim 1, wherein said ribs are oriented relative to said spine such that the longitudinal axis of each rib is substantially orthogonal to the longitudinal axis of said spine.

6. A single-piece multiple electrode conductor according to claim 5, wherein the longitudinal axis of all of said ribs are substantially parallel to each other.

7. A single-piece multiple electrode conductor for a piezoelectric solid state motor stack with piezoelectric disks, comprising:

a spine member for conducting electrical potential;

a plurality of ribs integral with and extending from said spine member substantially orthogonal to the longitudinal axis of said spine member; and a plurality of electrodes, each of said electrodes formed integral with one of said ribs, wherein when said electrodes are interleaved with the piezoelectric disks in the stack and are connected to and biased by a source of electrical potential, an axial displacement is produced between opposite end surfaces of the stack.

8. A single-piece multiple electrode conductor according to claim 7, wherein said spine member further comprises a series of accordion-style folds.

9. A single-piece multiple electrode conductor according to claim 7, wherein said spine member, said plurality of ribs and said plurality of electrodes are substantially flat.

10. A single-piece multiple electrode conductor according to claim 7, wherein the longitudinal axis of all of said ribs are substantially parallel to each other.

* * * * *